United States Patent [19]

Inouye et al.

[11] 4,232,070
[45] Nov. 4, 1980

[54] NON-ARCING DIELECTRIC MODULAR ARRAY

[75] Inventors: George T. Inouye, Ranchos Palos Verdes; Nathaniel L. Sanders, Anaheim; Winston C. Moss, Palos Verdes Estate, all of Calif.

[73] Assignee: TRW Inc., Redondo Beach, Calif.

[21] Appl. No.: 958,591

[22] Filed: Nov. 7, 1978

[51] Int. Cl.² ............................................... B32B 3/14
[52] U.S. Cl. ..................... 428/49; 428/447; 428/922; 244/173
[58] Field of Search ............ 136/89 P, 89 SA, 89 EP; 428/447, 922, 49; 244/158, 163, 173

[56] References Cited

U.S. PATENT DOCUMENTS

| | | | |
|---|---|---|---|
| 4,043,834 | 8/1977 | Rüch | 136/89 SA |
| 4,140,545 | 2/1979 | Nagao et al. | 136/89 P |

*Primary Examiner*—Aaron Weisstuch
*Attorney, Agent, or Firm*—John J. Connors; Donald R. Nyhagen

[57] ABSTRACT

A non-arcing modular dielectric array having an electrically conductive substrate mounting a multiplicity of spaced dielectric elements, such as second surface mirrors or solar cells, with outer dielctric surfaces spaced and electrically isolated from the substrate which tend to accumulate electrical charges in a plasma environment creating between the substrate and element surfaces large potential differences which induce arc discharges between the surfaces and substrate. The gaps between adjacent dielectric elements are filled with a resilient filler which provides about the individual elements conductive frames grounded to the substrate for bleeding charges from the element surfaces to the substrate to suppress arc discharges therebetween.

8 Claims, 5 Drawing Figures

NON-ARCING DIELECTRIC MODULAR ARRAY

BACKGROUND OF THE INVENTION

Arrays of so-called second surface mirrors or optical solar reflectors are commonly used on spacecraft for thermal control purposes. A typical second surface mirror for such an array consists of a 2 to 2½ inch square "window" of quartz or borosilicate glass 6 to 8 mil in thickness. The inner surface of this window is metalized with a silver film or the like having a thickness on the order of 100 to 1000 angstroms. The several second surface mirrors of such a second surface mirror array are bonded by silicone adhesive or the like to the exterior of the spacecraft which provides a supporting substrate for the mirrors. The thickness of the adhesive layer bonding each mirror to the spacecraft is on the order of 3 mil. A spacing on the order of 10 mil is provided between the adjacent second surface mirrors in order to accommodate thermal expansion and contraction.

The second surface mirror arrays in current use are subject to one inherent problem to which this invention is addressed. The problem referred to resides in the fact that the second surface mirrors constitute exterior dielectric surfaces of very high resistivity which may accumulate high electrical potential, on the order of kilovolts in magnitude, and high stored electrical energy, on the order of joules. Eventually, the accumulated electrical charges on the second surface mirrors may become so high as to cause an arc discharge from the mirror surfaces to the underlying metallic skin of the spacecraft. It has been determined that this energy discharge may occur in an arc lasting for about a microsecond with peak currents on the order of 1000 amperes. Such high current arc discharges constitute an extreme hazard to most spacecraft subsystems and hence present a serious problem to the spacecraft.

In connection with this arc discharge problem, it is significant to note that arc discharges from spacecraft exterior dielectric surfaces, such as second surface mirrors, were originally thought to be localized in extent to a few square centimeters or less. Recent experiments have demonstrated, however, that this is not the case. Such experiments have shown, for example, that many thousands of square centimeters of spacecraft surface may discharge in a single arc. Although the discharge duration increases somewhat with area, the peak discharge current also increases with area. Thus, the larger the contiguous areas subject to such arc discharges the greater are the peak currents and hence the potential hazard to the spacecraft. It should also be noted that arc discharges of the kind under discussion are not limited to discharges between individual mirrors and their supporting substrate. Thus, it has been observed that such discharges easily bridge the gaps between the adjacent mirrors.

The arc discharge problem to which this invention is addressed is not limited to spacecraft second surface mirror arrays and may exist, as well, in spacecraft solar arrays. Accordingly, while the invention will be described primarily in the context of a spacecraft second surface mirror array, the invention is not so limited. In this regard, it is significant to note at the outset that, in the present description, the expression "dielectric element" is used as a generic descriptor to include second surface mirrors, and other similar spacecraft mounted dielectric elements.

SUMMARY OF THE INVENTION

In contrast with a conventional second surface mirror or solar array, wherein only enough silicone adhesive is applied to the individual dielectric elements, i.e. second surface mirrors or solar cells, to hold these elements to their mounting substrate, i.e. the spacecraft skin or the solar array substrate, and the gaps between adjacent elements are left unfilled, a dielectric element array according to the present invention is characterized by gaps between the adjacent elements which are filled with a resilient conductive medium, which may be the silicone adhesive, grounded to the array substrate in such a way as to bleed electrical charges from the outer element surfaces to the substrate. The outer exposed surfaces of the silicone adhesive within these gaps are substantially flush with the outer surfaces of the elements and may be coated with a conductive paint which is grounded to the metallic mounting substrate of the dielectric array.

Filling the gaps of the dielectric array in this manner alleviates the arc discharge problem referred to earlier in two ways. First, the sharp corners and edges of the dielectric elements, and hence the intensified field gradients which normally exist at such edges and corners, are effectively eliminated by the filler medium. Secondly, the filler medium is selected to have sufficiently low electrical resistivity to drain off the electrical charge from the surfaces of the dielectric elements. This reduces the surface potential gradients on the dielectric elements and hence the tendency for arc discharges to occur.

A better understanding of the invention may be had from the following description taken in conjunction with the annexed drawings.

DESCRIPTION OF THE PREFERRED EMBODIMENTS

Figure 1:
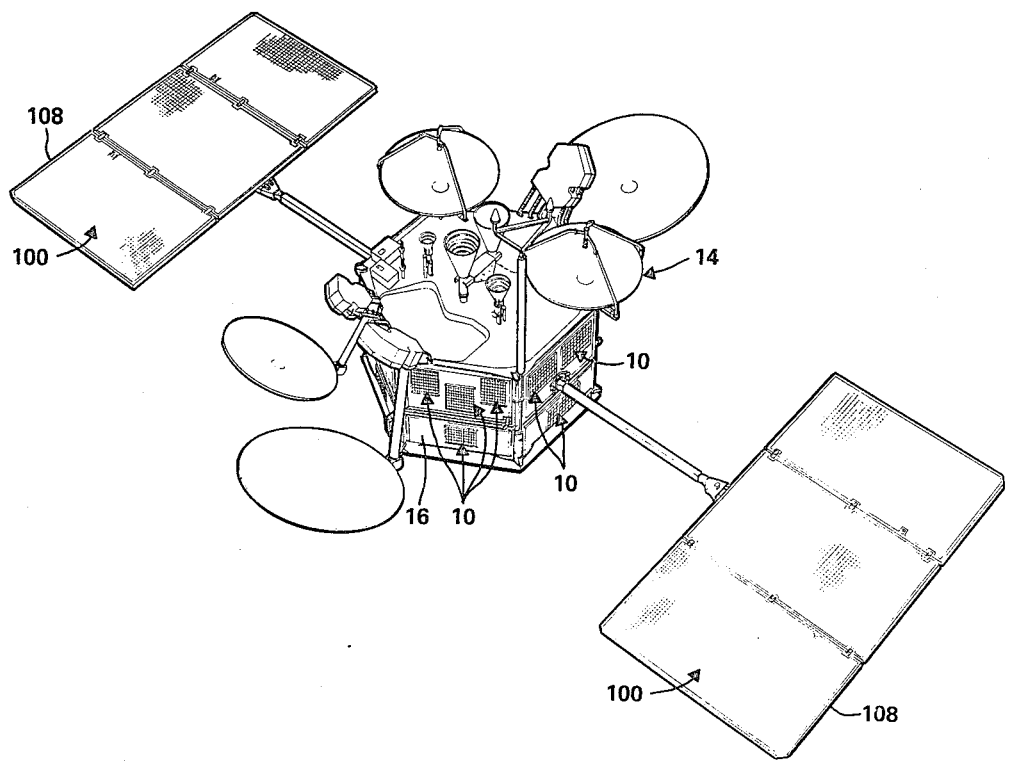
FIG. 1 is a perspective view of a spacecraft mounting improved second surface mirror arrays according to the invention.
Figure 2:
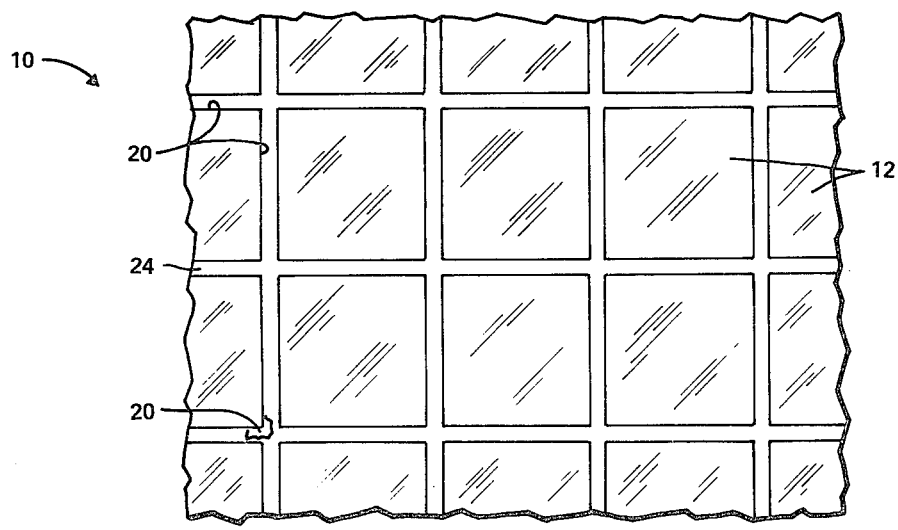
FIG. 2 is an enlarged fragmentary front view of one second surface mirror array in FIG. 1.
Figure 3:
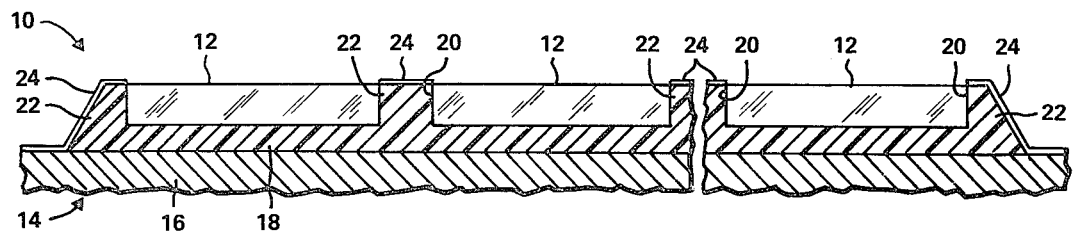
FIG. 3 is an enlarged section through the array in FIG. 2 normal to its plane.

In FIGS. 1-3 of these drawings, reference numeral 10 denotes an array of dielectric elements 12 which is subject to the arc discharge problem discussed earlier. As previously noted, the invention may be applied to second surface mirror arrays, solar arrays, and other similar spacecraft mounted dielectric elements. The particular dielectric array 10 illustrated is a second surface mirror array, in which the dielectric elements 12 are second surface mirrors for optical solar reflectors of the type which are mounted on a spacecraft 14 for thermal control purposes, as illustrated in FIG. 1.

Such second surface mirror arrays and second surface mirrors themselves are well-known in the art and hence need not be described in elaborate detail. Suffice it to say for the purposes of this disclosure that the individual second surface mirrors 12 typically comprise small squares or "windows," on the order of 2 to 2½ inches square of quartz or borosilicate glass. The inner or rear surface of each window has a metallized reflecting layer which is generally a vacuum deposited silver layer having a thickness on the order of 100 to 1000 angstroms. This metallized reflecting layer, in turn, is protected by a thin ceramic layer having a thickness on the order of 100 to 1000 angstroms.

The second surface mirror array 10 is mounted on the outer wall 16 of spacecraft 14 by adhesively bonding the individual second surface mirrors 12 to the wall by a silicone adhesive layer 18 on the order of 3 mils thickness. The mirror and adhesive layer thicknesses have been exaggerated in the drawings for clarity. The arrangement of the second surface mirror array on the spacecraft is determined by thermal analysis of the spacecraft and is of no concern to this invention. The silicone adhesive which is used to bond the second surface mirrors to the spacecraft possesses sufficient compliance to accommodate the thermal stresses which occur in the normal spacecraft environment.

As noted earlier, second surface mirrors of the kind described above provide dielectric surfaces on the spacecraft which can be charged to arcing potentials in the plasma environment of space. These dielectric surfaces may accumulate extremely high electrical potentials, on the order of kilovolts in magnitude, and high stored electrical energy, on the order of joules in magnitude with resultant electrical discharges between the mirrors and their mounting substrate. The peak electrical currents involved in these electrical discharges is so high as to constitute an extreme hazard for spacecraft subsystems.

Figure 4:
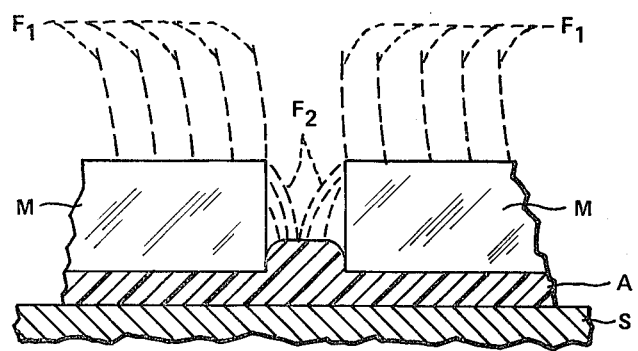
FIG. 4 is a further enlarged section through two adjacent mirrors of a conventional prior art second surface mirror array depicting the electrical field lines produced by electrical charge accumulations on the mirrors.

In this regard, attention is directed to FIG. 4 illustrating the arrangement of a conventional second surface mirror array. In this conventional array, the second surface mirrors M are secured by adhesive A, typically silicone adhesive, to a mounting substrate S, which is the metallic skin of the spacecraft. The arcing problem which this invention addresses is due to the fact that the glass or quartz windows of the second surface mirrors M have extremely high electrical resistivity. As a consequence, these windows accumulate a high electrical potential and high stored electrical energy in the plasma environment of space. The resulting electrical charge accumulations on the mirrors give rise to electrical field lines which are represented in FIG. 4 by the field lines $F_1F_2$. The arc discharges referred to above tend to occur along the electrical field lines $F_2$ within the intermirror gaps and between the outer surfaces of the mirrors and the underlying substrate S. Arc discharges also may occur across the gaps from one second surface mirror to another.

Figure 5:
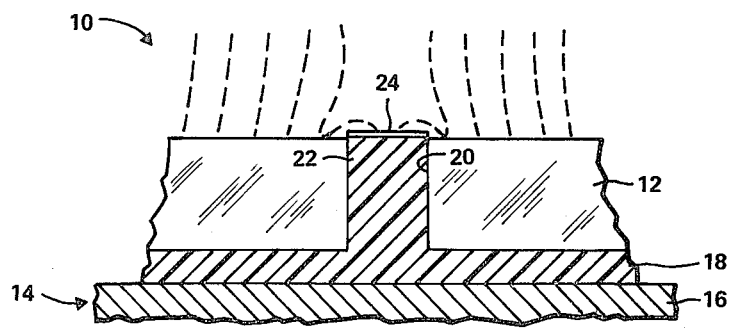
FIG. 5 is a section similar to FIG. 4 depicting the electrical field lines in an improved second surface mirror array of this invention.

Referring to FIG. 5, the present invention alleviates the arc discharge problem discussed above by filling the gaps 20 between the adjacent second surface mirrors 12 with an electrically conductive and physically resilient or compliant filler material 22. In the context of the present invention, the filler material 22 must have sufficient electrical conductivity to bleed off accumulated electrical charges from the second surface mirrors 12 to their mounting substrate 14 in such a way as to effectively eliminate harmful arc discharges between the mirrors and the substrate. The filler material must have sufficient physical resiliency or compliancy to accommodate expansion and contraction of the second surface mirror array in its normal operating environment. The invention accomplishes alleviation of the arc discharge problem in two ways. First, the filler material 22 substantially completely fills the intermirror gaps 20 such that the outer surfaces of the material are substantially flush with the outer surfaces of the second surface mirrors. The filler material thus effectively eliminates the sharp edges or corners of the second surface mirrors at which intensified field gradients tend to occur. Secondly, filler material provides electrically conductive paths for bleeding off electrical charges from the outer surfaces of the second surface mirrors to the mounting substrate 14.

It will be immediately evident to those versed in the art that these functions of the filler material 22 may be accomplished with different types of filler material. In the case of second surface mirrors, the electrical conductivity of the filler material should be as high as possible. In accordance with the preferred practice of the invention, the filler material 22 comprises the same silicone adhesive which is used to bond the second surface mirrors 12 to the bonding substrate 14 and an electrically conductive film 24 of conducting paint or the like is applied to the outer exposed surfaces of the filler material and grounded to the metallic substrate 14. In this case, the conductive film 24 provides the primary electrically conductive path through which accumulated electrical charges are bled off from the second surface mirrors to the substrate. It is believed possible, however, to use silicone adhesive without the conductive film material 24. In this case, the electrical charges bleed off from the mirrors to the substrate through the adhesive. It will now be understood, therefore, that the invention effectively provides around the individual second surface mirrors 12 electrically conductive frames which are grounded to the bonding substrate 14 through which accumulated electrical charges bleed off from the second surface mirrors to the substrate.

Concerning the arc discharge alleviating action achieved by this invention, attention is directed to FIG. 5 which illustrates the electrical field lines $F_1F_2$ produced by accumulated electrical charges on the second surface mirrors 12. It will be observed in this FIG. that the intensified field gradients which exist along the edges of the second surface mirrors M in FIG. 4 are virtually eliminated in the improved second surface mirror array of FIG. 5. This elimination of intensified field gradients about the mirror edges in combination with the conductive path provided by the filler material 22 for bleeding electrical charges from the second surface mirrors greatly reduces or entirely eliminates arc discharges from the second surface mirrors in the space environment.

The arc discharge suppressing action of the invention has been verified with respect to second surface mirrors by actual test involving both measurement of and observation of arc discharges from the second surface mirrors of both conventional mirror arrays (FIG. 4) and arrays (FIGS. 1–3) constructed in accordance with the present invention, when irradiated from a 20 kilovolt electron gun with electron current having a magnitude on the order of 10 na/cm$^2$. The second surface mirrors utilized in the test had quartz windows. All of the test samples consisted of 6 such second surface mirrors bonded to an aluminum substrate with approximately a 3 mil thickness of silicone adhesive. One test sample embodying the invention was fabricated by first adhesively bonding the second surface mirrors to the substrate and sometime thereafter filling in the gaps between the adjacent mirrors with silicone adhesive flush with the outer surfaces of the mirrors. The exposed outer surfaces of the filler material were not coated with an electrically conductive film. This test sample is referred to as the uncoated sample. A second test sample constructed in accordance with the invention was fabricated in the same manner except that after the intermirror gaps were filled with silicone adhesive, the outer exposed surfaces of the filler material within the gaps were coated with an electrically conductive film, specifically a thin coat of Emerson and Cuming's CC-40 conducting paint. This paint was grounded to the aluminum substrate in the manner illustrated in FIG. 3. This test sample is referred to as the coated sample.

The arc discharge test conducted with the uncoated test sample of the invention demonstrated no significant reduction in the arc discharge rate at room temperature as compared with the test sample having a conventional second surface array construction. It is conjectured, however, that the negative result of this test, i.e. failure to demonstrate significant reduction in the arc discharge rate, is probably due to the fact that the gaps between the adjacent second surface mirrors were filled with the silicone filler material after setting of the silicone adhesive used to bond the mirrors to the substrate. As a consequence, it is believed that the silicone filler material did not adhere effectively to the previously applied silicone adhesive material which bonded the mirrors to the substrate and hence did not provide an effective electrical charge leakage path from the outer surfaces of the mirrors to the substrate. It is believed that this problem can be overcome by bonding the mirrors to the substrate and filling the gaps between the mirrors all in a single operation so as to provide an effective homogeneous leakage path through the silicone filler material all the way from the outer mirror surfaces to the substrate. Also, other resilient filler materials, such as filled materials, having a higher electrical conductivity than pure silicone rubber, may be utilized.

In contrast, the test conducted with the coated second surface mirror array sample constructed in accordance with the invention clearly demonstrated the effectiveness of the invention to suppress arc discharges. Thus, these latter tests demonstrated a marked reduction in the arc discharge rate. Thus, the arc discharge rate of both the conventional test sample and the uncoated test sample of the invention, when irradiated with electron current of 10 na/cm$^2$, was on the order of 7 arcs per minute. In contrast, with the coated test sample array irradiated at a beam current level of 14 na/cm$^2$, two arcs occurred during the first five minutes of exposure due, it is believed, to incomplete outgassing, and thereafter no arcs occurred for the next 10 minutes of exposure. The irradiation current was then increased to 90 na/cm$^2$ and still no further arcing was observed although the test was continued for about one-half hour.

It is now apparent, therefore, that the present invention achieves two distinct advantages. First, sharp edges and corners at which intensified electrical field gradients tend to occur due to accumulation of electrical charges on the outer surfaces of the dielectric elements in a plasma environment are substantially reduced or virtually eliminated. Secondly, the filler material between the adjacent dielectric elements provides a relatively low resistivity path through which accumulated electrical charges on the element surfaces may drain off to the mounting substrate by means of surface leakage and/or leakage through the filler material itself. This leakage of accumulated electrical charges from the element surfaces, in turn, minimizes surface potential gradients and hence the propensity for arc discharges to occur.

We claim:

1. In combination:
a mounting substrate,
a dielectric element mounted on said substrate having an outer surface spaced from said substrate which tends to accumulate a high electrical charge relative to said substrate in a plasma environment and thereby induce arc discharge between said surface and substrate, and
resilient electrically conductive means about the edges of said element disposed in electrically conductive relation to said element surface and grounded to said substrate to provide an electrically conductive path about said element for bleeding electrical charges from said surface to said substrate and thereby suppressing said arc discharges.

2. The subject matter of claim 1 wherein:
said resilient electrically conductive means comprises a resiliently compliant medium.

3. The subject matter of claim 2 wherein:
said medium has an exposed surface coated with an electrically conductive film grounded to said substrate for conducting electrical charges from said element surface to said substrate.

4. The subject matter of claim 3 wherein:
said medium is silicone rubber, and
said element comprises a second surface mirror bonded to said substrate by a silicone adhesive integrally joined to said medium.

5. A non-arcing dielectric array comprising:
a substrate,
a plurality of dielectric elements mounted side by side on said substrate with narrow gaps between the adjacent elements,
each element having an outer surface spaced from said substrate which tends to accumulate a high electrical charge relative to said substrate in a plasma environment and thereby induce arc discharges between said surface and substrate, and
resilient electrically conductive filler means filling said gaps in electrically conductive relation to said element surfaces and grounded to said substrate to form about the edges of said elements conductive paths for bleeding electrical charges from said surfaces to said substrate.

6. The subject matter of claim 5 wherein:
said filler means comprises a resiliently compliant medium.

7. The subject matter of claim 6 wherein:
said filler medium has outer exposed surfaces substantially flush with said element surfaces and coated with an electrically conductive film grounded to said substrate.

8. The subject matter of claim 7 wherein:
said elements comprise second surface mirrors.

* * * * *